(12) United States Patent
Kobayashi et al.

(10) Patent No.: US 6,268,986 B1
(45) Date of Patent: Jul. 31, 2001

(54) MOTOR CONTROL UNIT

(75) Inventors: Masaru Kobayashi; Hirotoshi Maekawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/421,480

(22) Filed: Oct. 20, 1999

(30) Foreign Application Priority Data

May 11, 1999 (JP) ................................. 11-130676

(51) Int. Cl.[7] ........................................ H02H 5/04
(52) U.S. Cl. ................................ 361/24; 361/25
(58) Field of Search ................ 361/23, 24, 25, 361/27; 318/798, 471–473; 363/50–56

(56) References Cited

U.S. PATENT DOCUMENTS

| 5,070,426 | * | 12/1991 | Iwasa et al. | 361/91.5 |
| 5,430,636 | * | 7/1995 | Kachi | 363/58 |
| 5,483,167 | * | 1/1996 | Mikami | 324/510 |
| 5,936,820 | * | 8/1999 | Umemura et al. | 361/103 |

FOREIGN PATENT DOCUMENTS

| 7-194094 | 7/1995 | (JP) . |
| 8-316471 | 11/1996 | (JP) . |
| 10-210790 | 8/1998 | (JP) . |

OTHER PUBLICATIONS

IPM employed to Electric Automobile, by Akira Fujita et al., Mitsubishi Electric Technical Journal, No. 72, vol. 12, pp 61–64, Dec. 25, 1998.

* cited by examiner

*Primary Examiner*—Michael J. Sherry
(74) *Attorney, Agent, or Firm*—Sughrue, Mion, Zinn, Macpeak & Seas, PLLC

(57) ABSTRACT

In a motor control unit adapted to control each switching element of each switching arm and control the current sent to a motor, the temperature sensing diodes 19a~19c are arranged near the switching elements and a constant current circuit 18 is connected to the temperature sensing diode. An overheat prevention means is also provided to recognize the switching element temperature by detecting a forward voltage value of the diode and to place the switching element in an OFF-state when the switching element is judged to be in an overheat condition based on the recognized temperature of the switching element.

12 Claims, 15 Drawing Sheets

MOTOR CONTROL UNIT

BACKGROUND OF THE INVENTION

1. Field of the Invention

The present invention relates to a motor control unit which drives a motor using a power converting semi-conductor, and more particularly to the overheat protection of the power converting semi-conductor and the temperature control of the motor control unit.

2. Description of the Prior Art

A first example of a conventional motor control unit provided therein with overheat protection function is shown in FIG. 14. In the first example as shown in FIG. 14, a three-phase alternating current motor is used as a motor and an inverter is used as a power converter, respectively.

In FIG. 14, reference numeral 1A is a motor control unit, reference numeral 2 is a motor, 3A a control computing unit and 4A a power converting semi-conductor. The power converting semi-conductor 4A is provided with three-phase switching arms (U phase arm, V phase arm and W phase arm), an overheat identification means 8A and an overheat protection means 9A. The U phase arm that is one of the switching arms consists of an upper arm switching element 5a, a lower arm switching element 5b, an upper arm free-wheeling element 6a, a lower arm freewheeling element 6b, an upper arm gate switching element 7a, a lower arm gate switching element 7b and thermistors 10 and 11. The V phase arm and the W phase arm have the same structure as the U phase arm. A bipolar transistor is used here as the switching element. In the drawing, C, G and E show a collector, a gate and an emitter, respectively.

The motor control unit 1A generally converts direct-current power from an electric power unit (not shown) into alternating-current power and supplies it to the motor 2. The conversion from direct-current power to alternating-current power is carried out by switching the switching elements consisting of a power element of the power converting semi-conductor 4A. The power elements consist of the switching elements and the freewheeling elements. A gate driving signal which is generated in the control computing unit 3A for switching is connected to gates G of the switching elements through the gate switching elements. When the switching elements are electrified by switching, they generate heat due to internal loss. Overheating may destroy the switching elements. To avoid the possible destruction of the switching elements, overheat protection is provided by monitoring the temperature of the switching elements, cutting off (gate cut) the signal flowing from the control computing unit 3A to the gates of the switching elements when the temperature reaches a predetermined level, and breaking the electric current sent to the switching elements. A protection function operation alarm signal is transmitted to the control computing unit 3A when the overheat protection is carried out. In the drawing, an over-heat identification means 8A determines by a signal from the thermisitor 10 whether the temperature sensing and gate-cut are necessary or not. The signal for gate cutting is generated in the overheat protection means 9A to effect the gate cutting by gate switching elements 7a and 7b. The thermistor 10 is disposed near the switching elements to reflect the temperature of the switching elements correctly.

Another thermistor 11 is disposed on the periphery of the switching elements as a means of informing the control computing unit 3A of the temperature of the switching elements. In the control computing unit 3A, the temperature information of the switching elements is obtained from the thermistor 11 by, for example, a microcomputer or an A/D converter. With this temperature information (signal), a gate driving signal is operated so that the temperature of the switching elements us not raised excessively.

As a second conventional example, Japanese laid-Open Patent Application (Kokai) No. Hei 10-21079 discloses a control unit for protecting switching elements from over-heating by using a temperature signal from a power converting semi-conductor. In this second conventional example, a motor control unit for proving overheat protection is applied to an electric vehicle. FIG. 15 shows this second conventional example.

In FIG. 15, reference numeral 2 is a motor, reference numeral 12 is a battery, 13 a power converter, 14 wheels, 15 a power converter ECU (an electronic control unit), 16 an accelerator pedal, and 17 a temperature sensor, respectively.

The power converter 13 is connected to the battery 12 serving as a power unit and the motor 2 for driving the vehicle is connected to the power converter 13. The driving force of the motor 2 is transmitted to the wheels 14 through a rotation axis and a differential gear to serve as the propulsive force of the vehicle. The power converter 13 is provided with the power converting semi-conductor. Also, the power converter 13 is controlled by the power converter ECU 15, and the power converting semi-conductor within the power converter 13 starts a switching operation according to a gate driving signal input from the power converter ECU 15. With this switching operation, the direct-current power supplied from the battery 12 is converted to alternating-current power to be supplied to the motor 2.

The power converter ECU 15 is connected to an accelerator pedal 16 and adapted to detect an amount of pressure as an accelerator opening A% when a driver depresses the accelerator pedal 16. It is however noted that the accelerator opening is 100% when the accelerator pedal is fully pressed.

The power converter ECU 15 is also connected to the temperature sensor 17 disposed within a case of the power converter 13 to gain the temperature INV-T of the switching elements. Further, the power converter ECU 15 determines the amount of change of the element temperature per unit time based on the element temperature INV-T to allow the temperature change rate to be $\Delta T/\Delta t$.

The power converter ECU 15 determines a torque to be output from the motor 2 according to the accelerator opening A% and converts the torque found to a torque command*. Further, the following two kinds of limiting rates (a first limiting rate $\alpha$, a second limiting rate $\beta$) multiplied by the torque command T make the regulated torque command T*. This first limiting rate $\alpha$ is determined based on the element temperature INV-T. The first limiting rate $\alpha$ is 100% when the element temperature INV-T is below a limitation start temperature T1. When the element temperature INV-T is higher than the limitation start temperature T1, the first limiting rate $\alpha$ corresponding to the element temperature INV-T at that time is multiplied by the torque command T*. When the element temperature INV-T reaches a zero-power temperature T2, the first limiting rate $\alpha$ is 0 and the torque command T* is also 0.

The second limiting rate $\beta$ is determined based on the temperature change rate $\Delta T/\Delta t$. The second limiting rate is used when the element temperature INV-T is above the limitation start temperature T1. When the temperature change rate $\Delta T/\Delta t$ is below a first reference value $\delta 1$, the second limiting rate $\alpha$ is 100%. When the temperature change rate $\Delta T/\Delta t$ is higher than the first reference value $\delta 1$, the second limiting rate $\beta$ corresponding to the temperature change rate ΔT/Δt at that time is multiplied by the torque command T*. When the temperature change rate ΔT/ Δt is above a second reference δ2, the second limiting rate β is 0 and the torque command T* is also The power converter ECU 15 obeys the regulated torque command T* found by the above and a command value I* of a motor electrifying current corresponding to the regulated torque command T*. The generating torque of the motor 2 is controlled to coincide with the regulated torque command T* by switching the switching elements of the power converting semi-conductor based on this current command value I*.

As described above, the switching element temperature is high in the second conventional example and when it rises quickly, the switching elements are kept from overheating by regulating the torque command substantially. On the other hand, when the temperature of the switching elements is high but has not risen quickly, the torque command need not be regulated as much as in the quick rise. Thus, it is possible to prevent the switching elements from overheating while regulating the torque according to the extent of the temperature.

According to the first conventional example, it is possible to provide overheat protection by switching stop (gate cut) and overheat prevention by temperature rise monitoring relative to the temperature rise of the switching elements in the power converting semi-conductor.

However, according to the first conventional example, the thermistor 10 serving as the temperature sensor for overheat protection differs from the thermistor 11 serving as the temperature sensor that transmits the temperature of the switching elements to the control computing unit 3A. It is also difficult to let the temperature of the switching elements indicated by the thermistor 10 coincide precisely with that of the switching elements indicated by the thermistor 11 due to the distance of the switching elements from their tips as seen in the arrangement and the dispersion of electrical characteristics of each sensor. Therefore, when it is required to operate a gating signal for switching the power converting semi-conductor 4A for overheat prevention through temperature monitoring by the thermistor 11 before the overheat protection by the thermistor 10 is activated, it is necessary to absorb the dispersion of the sensor by setting a threshold temperature starting operation of the gating signal to a lower value. However, when the threshold temperature is thus set to the lower value, there is some possibility that the overheat prevention process is frequently carried out even in a normal operation and this is therefore not practical. On the contrary, when the threshold temperature is set to a normal value (not low), there is some possibility that the overheat protection by the thermistor 10 is carried out prior to the start of the overheat prevention process depending on the dispersion of the sensor, and the switching operation of the switching elements stops to interrupt the control. Such a property is not desirable in the motor control unit of the present invention.

Also, according to the second conventional example, even when the switching element temperature of the power converting semi-conductor rises suddenly, it is possible to prevent the switching element from overheating by regulating not only a torque command of the motor, but also an electrifying current command according to a rate of change per unit time of the switching element temperature. The regulating amount of the torque command is increased or decreased to provide the proper torque regulation according to whether the switching element temperature is high or low.

However, in the second conventional example, when a temperature signal of the switching element to be connected to the power converter ECU 15 changes suddenly for some reason such as wire breakage or the temperature sensor failure of the switching element, the torque command is regulated substantially because a rate of change per unit time of the switching element temperature is large, thereby resulting in a sudden change in the generating torque of the motor. This property is not desirable in an on-vehicle motor control unit including an electric vehicle because it has a bad influence on the continuity of control and affects the vehicle behavior system as well.

SUMMARY OF THE INVENTION

It is therefore an object of the present invention to provide a motor control unit which overcomes all of the above-noted drawbacks in the prior art and can quickly and precisely detect the temperature of a switching element forming a power element of a power converting semi-conductor and properly prevent the switching element from overheating, thereby securing the continuity of control.

According to the present invention, there is provided a motor control unit comprising a first switching element disposed on a high potential side, a second switching element disposed on a low potential side, a plural phase of switching arms connecting the first switching element and the second switching element together in series, and connected to a direct-current power input in parallel to supply an alternating-current motor with alternating-current power from between each switching element of each switching arm, a control computing unit for controlling the switching of each switching element to control a current of the motor, and wherein a semi-conductor element including a P-N junction is disposed near the switching element and connected to a constant current circuit, and wherein an overheat prevention means is provided to recognize the temperature of the switching element by sensing a forward voltage value between the P-N junction of the semi-conductor and places the switching element in an OFF-state when the switching element is judged to be in an overheat condition based on the recognized temperature of the switching element.

The control computing unit further comprises a current command value computing means for computing a current command value sent to the motor, a current control means for controlling a current sent to the motor based on the current command value, and a monitoring means for inputting the temperature of the switching element and the current command value, monitoring the relation between the switching element temperature and the current command value in time sequence and controlling the current command value to let the motion of the motor vary moderately in the case of failure such as damage to the semi-conductor element and wire breakage.

In place of the monitoring means, there is also provided another monitoring means for inputting the motor temperature, the switching element temperature and the current command value, monitoring the relation between the motor temperature, the switching element temperature and the current command value in time sequence, and controlling the current command value to let the motion of the motor vary moderately in the case of failure such as damage to the semi-conductor element and wire breakage.

The control computing means is also provided with a current calculating means for calculating a current value sent to the switching element based on the switching element temperature and an output terminal voltage value of the switching element.

Also, the overheat prevention means is designed to memorize the forward voltage value of the semi-conductor element in advance at the fixed temperature so that it can recognize the variation when the absolute magnitude of the switching element temperature varies.

The overheat prevention means is designed to transmit the switching element temperature to the control computing unit in the form of an analog signal or to transmit information as to whether the overheat prevention of the switching element is now being carried out or not to the control computing unit in the form of a digital signal. It is also designed to recognize the highest temperature of each phase of the switching element and make a judgment based on this highest temperature.

The semi-conductor element is also arranged within the tip area where the switching element is formed or close to the tip area.

A diode is, for example, used as the semi-conductor. A bipolar transistor is used, for example, for the switching element and the collector-to-emitter voltage value of the bipolar transistor as the switching element is detected by the voltage sensing means.

The above and other objects, features and advantages of the present invention will become more apparent from the following description when taken in conjunction with the accompanying drawings.

BRIEF DESCRIPTION OF THE ACCOMPANYING DRAWINGS

DESCRIPTION OF THE PREFERRED EMBODIMENTS

1$^{st}$ Embodiment

A first embodiment of a motor control unit according to the present invention will be explained hereunder according to FIGS. 1 and 2.

Figure 1:
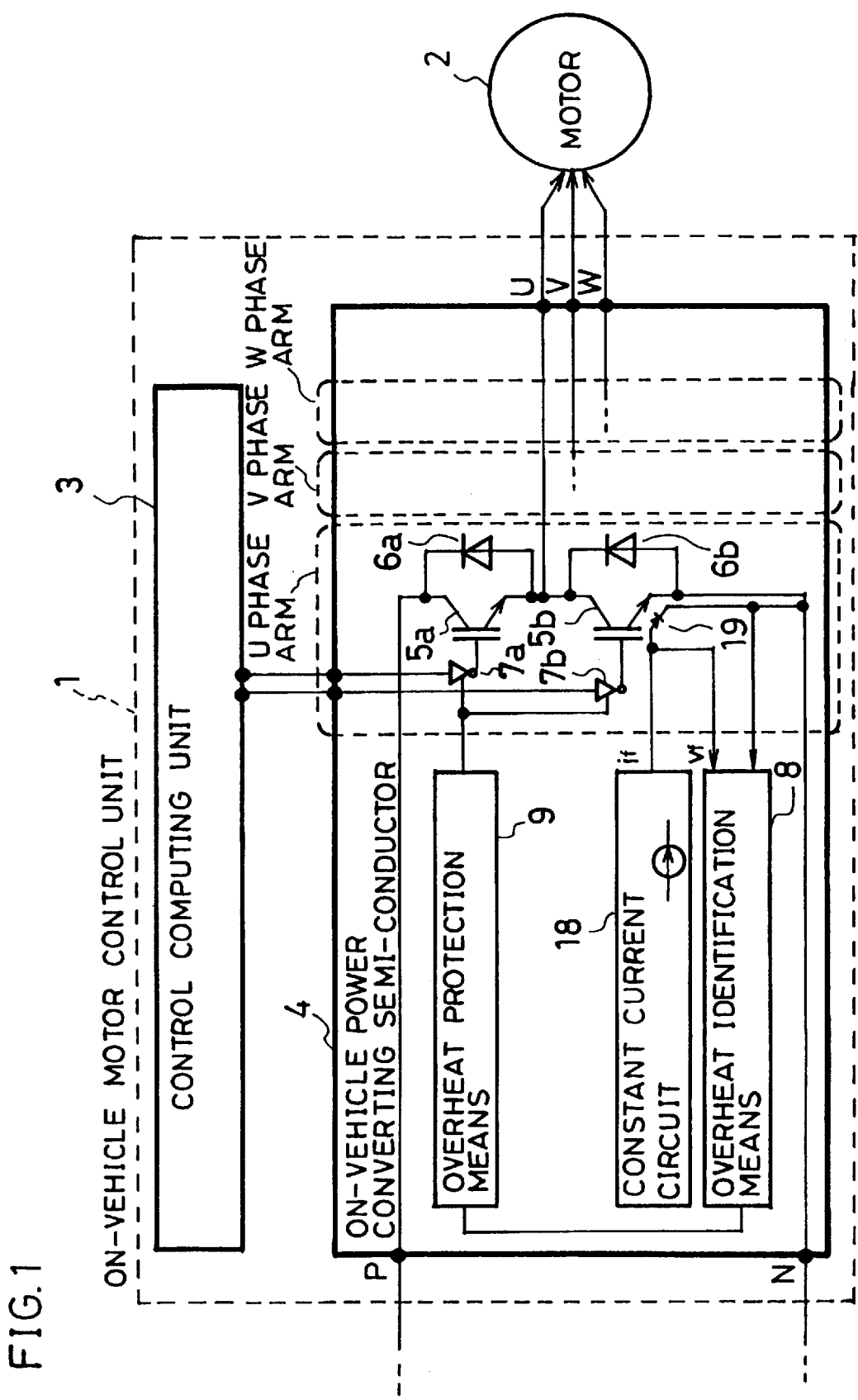
FIG. 1 is a block diagram of a motor control unit according to a first embodiment of the present invention.

FIG. 1 is a block diagram showing a structure example of a motor control unit of the present invention. Here is explained an on-vehicle motor control unit, but it is to be noted that the motor control unit can of course be used for other vehicles as well.

In FIG. 1, reference numeral 1 denotes an on-vehicle motor control unit, reference numeral 2 denotes a motor, 3 a control computing unit, and 4 an on-vehicle power converting semi-conductor, respectively. The on-vehicle power converting semi-conductor 4 serving as a power converting unit is provided with three-phase of switching arms (U-phase arm, V-phase arm and W-phase arm), an overheat identification means 8, an overheat protection means 9, and a constant current circuit 18 adapted to send an electric current to a temperature sensing diode (described below). The U-phase arm that is one of the switching arms consists of an upper arm switching element 5a, a lower arm switching element 5b, an upper arm freewheeling element 6a, a lower arm freewheeling element 6b, an upper arm gate switching element 7a, a lower arm gate switching element 7bm and the temperature sensing diode 19. The V-phase arm and W-phase arm have the same structure as the U-phase arm. A bipolar transistor is used here for the switching element.

One switching element and one freewheeling diode form one power element. Namely, two power elements are connected in series per phase of the three-phase alternating current. The side lying on a high potential side of the direct-current power input is called "an upper arm" and theat lying on a low potential side is called "a lower arm", respectively. The temperature sensing diode 19 serving as a temperature sensor for the switching element forming the power element is formed on the same board as the power element.

The overheat identification means 8 inputs a forward voltage value generating between the anode and the cathode (P-N junction) of the temperature sensing diode 19 that is a semi-conductor element including the P-N junction and judges whether overheat protection should be carried out or not by reading variations of the input forward voltage value. This overheat identification means 8 outputs a break indication signal (hereinafter referred to as "a gate-cut indication signal") of a gating signal to the overheat protection means 9 when it judges the overheat protection to be carried out. The overheat identification means 8 and the overheat protection means 9 form the overheat prevention means.

The overheat protection means 9 outputs a signal having the gate switching element turn off to the gate switching element when it inputs the gate cut indication signal from the overheat identification means 8, and breaks the transmission of the gating signal from the control computing unit 3 to the switching element.

Namely, the on-vehicle motor control unit 1 of the first embodiment is formed by the on-vehicle power converting semi-conductor 4 and the control computing unit 3 having the above-mentioned structure.

An operation of this embodiment will now be described.

The on-vehicle power converting semi-conductor 4 is connected to an electric power unit (not shown) and converts an input direct-current power to an alternating-current power and sends it to a motor 2. The conversion from direct-current power to alternating-current power is executed by switching the switching element forming the power element of the on-vehicle power converting semi-conductor 4. In the control computing unit 3, the command value of the electric current to be electrified is computed to enable the motor 2 to perform the required motion and the gating signal for turning the switching element ON/OFF is generated to enable the current of the current command value to flow. The gating signal is transmitted to a gate G of the upper and lower switching elements of each phase.

When electricity is turned on by switching, the switching element generates heat due to the internal loss. There is the possibility of an overheating failure of the switching element when the switching element generates heat. Therefore, the overheat identification means 8 detects the temperature of the switching element and judges whether the gate cut of the gating signal should be carried out or not to provide the overheat protection. When the overheat identification means 8 judges the gate cut should be carried out, it sends a gate cut indication signal to the overheat protection means 9. Upon receipt of the gate cut indication signal, the overheat protection means 9 sends the gate cut signal to a gate switching means to close the gate switching means and breaks the transmission of the gate signal to the switching element.

The temperature sensing of the switching element by the overheat identification means 8 is carried out as specified below. A constant current if flowing from a constant current circuit 18 flows into the anode side of the temperature sensing diode 19 and flows out of the cathode side. The electrifying current at this time is called a forward current in view of the polarity when it flows into the temperature sensing diode 19. Also, a potential difference generated between the anode and the cathode of the temperature sensing diode 19 is called a forward voltage vf. The overheat identification means 8 is connected to the anode and the cathode of the temperature sensing diode 19 and inputs the forward voltage vf.

Figure 2:
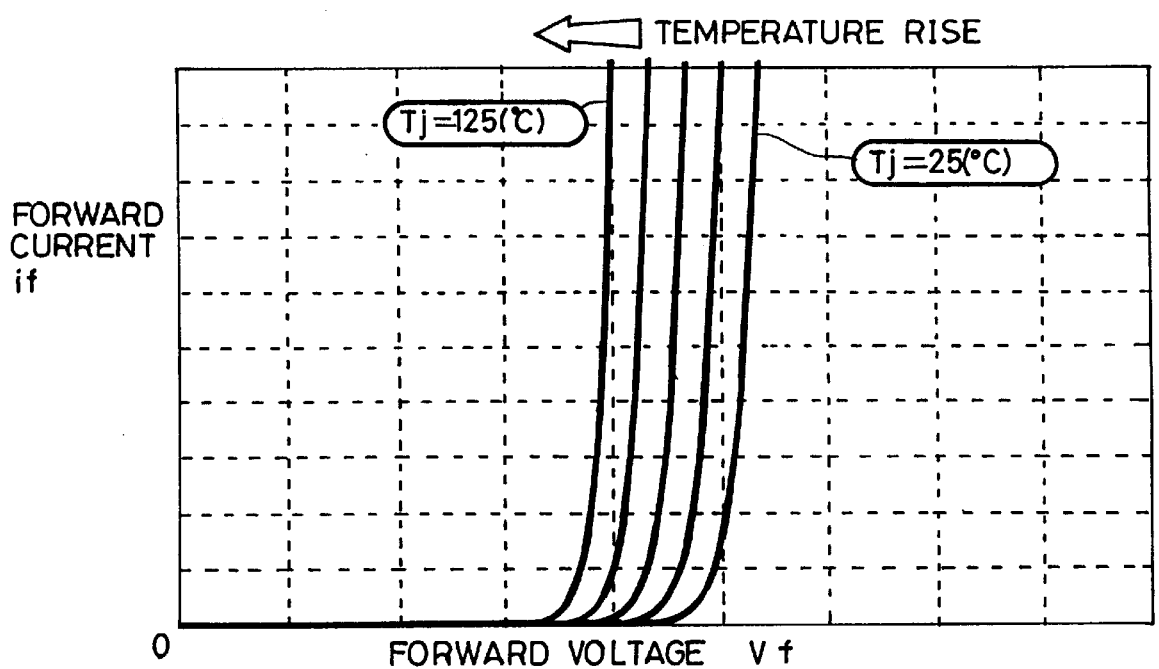
FIG. 2 is a view explaining the first embodiment.

A characteristic curve between the forward voltage Vf and the forward current if of the temperature sensing diode 19 is shown in FIG. 2. Namely, the forward voltage vf relative to the forward current if varies according to the junction temperature Tj of the temperature sensing diode 19. The forward voltage falls relative to a rise in the junction temperature Tj.

Figure 3:
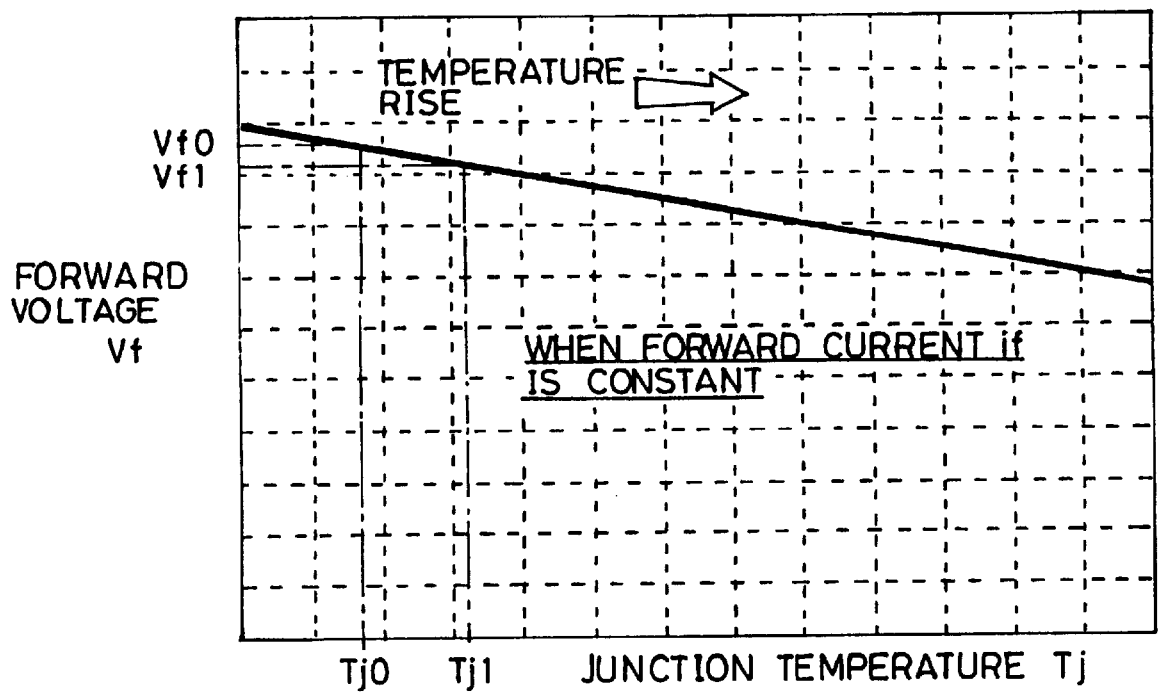
FIG. 3 is a view explaining a second embodiment.

The forward voltage vf when a constant forward current if is sent to the temperature sensing diode 19 has such characteristics as shown in FIG. 3 relative to the junction temperature Ti. Namely, the forward voltage vf decreases as the junction temperature Tj rises. Accordingly, if variations of the forward voltage vf of the temperature sensing diode 19 to which a constant forward current is sent are read, it is possible to sense the change of the junction temperature Tj of the temperature sensing diode 19.

That is, the overheat identification means 8 inputs the forward voltage vf of the temperature sensing diode 19 and recognizes variations of the junction temperature Tj of the temperature sensing diode 19. In this case, it is possible to read the junction temperature Tj of the temperature sensing diode 19 as the switching element temperature by arranging the temperature sensing diode 19 near the switching element and by setting the forward current if of the temperature sensing diode 19 at a lower value at which the diode itself does not overheat.

Thus, it is possible to recognize the switching element temperature by sending a constant forward current to the temperature sensing diode that is formed on the same board as the power element and arranged near the switching element and by reading the forward voltage of the temperature sensing diode. Since this temperature sensing is much faster than that by a thermistor and the temperature rise of the switching element is detected precisely within a short time, it is possible to improve the overheat protection characteristics of the switching element.

$2^{nd}$ Embodiment

It may also be advisable to have the overheat identification means 8 memorize the forward voltage value of the temperature sensing diode 19 at the fixed temperature.

A second embodiment will be explained below according to FIG. 3. The forward voltage at the temperature Tj0 is Vf0. As a result of subsequent variation of the switching element temperature, when the sensed forward voltage value is Vf1, the present temperature Tj1 is determined as the temperature variation corresponding to $\{Tj0-(Vf1-Vf0)\}$. Now, since an amount of change $\Delta vf$ of the forward voltage value relative to a rate of change $\Delta Tj$ of the junction temperature is constant regardless of the junction, if the absolute value of the junction temperature relative to a certain forward voltage value is determined, it is possible to detect the absolute quantity of the junction from time to time no matter how the forward voltage varies. Therefore, when the forward voltage value of the temperature sensing diode 19 is memorized at a fixed temperature, for example at a temperature at which we can recognize the switching element temperature at room temperature without the help of the temperature identification means 8A, it is possible to compute the junction temperature, that is, the absolute magnitude of the switching element temperature, quickly and precisely, even if the switching element temperature varies afterwards.

$3^{rd}$ Embodiment

Figure 4:
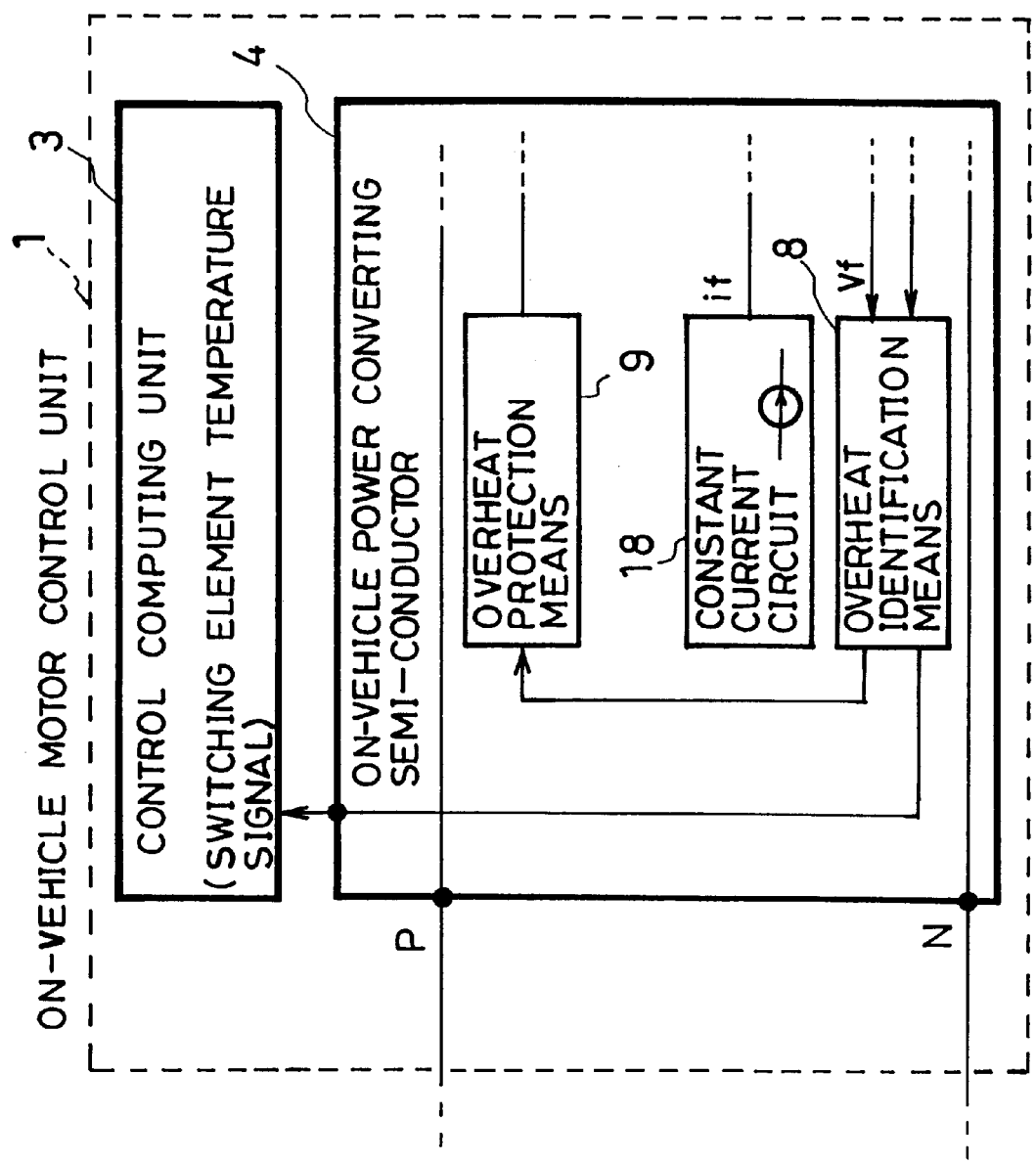
FIG. 4 is a block diagram of a motor control unit according to third and fourth embodiments.

As shown in FIG. 4, it may also be advisable to add a function transmitting the temperature information (signal) of the switching element as an analog signal to the control computing unit 3, to the overheat identification means 8.

Namely, when the forward current is sent to the temperature sensing diode 19 by a constant current circuit 18, the forward voltage vf of the temperature sensing diode 19 at this time is input to the overheat identification means 8. In the overheat identification means 8, the switching element temperature is computed in the overheat identification means 8 in the same manner as in the embodiments 1 and 2. The overheat identification means 8 further judges whether the gate cut of the gating signal should be carried out or not for overheat protection based on the computed switching element temperature. The overheat identification means 8, when judged to carry out the gate cut, sends the gate cut indication signal to the overheat protection means 9. At the same time, the overheat identification means 8 transmits the absolute magnitude of the switching element temperature to the control computing unit 3 as an analog signal. The control computing unit 3 operates the gating signal of the switching element forming a power element by using the temperature information of the input switching element. Since the temperature information of the switching element is equal to that used inside the overheat identification means 8a for judging conditions on whether the gate cut should be carried out or not, if the gating signal is operated so that heat generation of the switching element is controlled before the switching element temperature reaches a threshold temperature for executing the gate cut, there is no possibility that during the control operation of the on-vehicle motor control unit 1, the control motion will be interrupted by the gate cut for overheat protection and seriously affect the vehicle action.

It is to be noted that the switching element temperature information transmitted from the overheat identification means 8 to the control computing unit 3 may be the amount of change per unit time of the switching element temperature, increase or decrease of the switching element temperature after starting the on-vehicle motor control unit 1, or a combination thereof.

4th Embodiment

A function for transmitting information on whether overheat protection is being carried out or not to the control computing unit 3 as a digital signal may be added to the overheat identification means 8.

Namely, the overheat identification means 8 judges whether the gate cut of the gating signal should be carried out or not for overheat protection based on the computed switching element temperature. The overheat identification means 8, when judged to carry out the gate cut, sends a gate cut indication signal to the overheat protection means 9 and transmits information as to whether the overheat protection is being carried out or not to the control computing unit 3 as a digital signal. The digital signal as stated here may be a High/Low binary level of a logic element or the serial communication by binary level of time combination.

Further, the control computing unit 3 performs a predetermined motion to secure safety of the vehicle motion till the overheat protection is removed based on the input information on whether the overheat protection is being carried out or not, and controls, for example, the driving of a fan or a blower for heat radiation so that the overheat protection can be soon removed. The predetermined motion includes warning to the driver by lamps, voice, and the like such as an overheat warning indication in an engine driven vehicle. When a drive motor in a hybrid car controlled, the motor output is also controlled during control of electricity for overheat protection and motion for output control of an engine is expected, forecasting the output shortage of the motor.

Thus, the information transmitted from the overheat identification means 8A to the control computing unit 3 may indicate whether the overheat protection has already been carried out, the overheat protection was carried out more than a fixed number of times, the overheat protection rose to a lower temperature by a fixed value than the threshold temperature executed, the overheat protection will be carried out after a fixed time in the future, or a combination thereof.

5th Embodiment

An embodiment in which the overheat protection can be carried out according to the heat generating conditions of each phase of the switching element will be explained with reference to FIG. 5. In each phase of the arms, U, V, and W, the temperature sensing diode, as shown in FIG. 1, is formed on the same board as the power element. The V phase arm and the W phase arm have the same structure as the U phase arm, but in the figure, they are given different alphabetical designations.

The temperature sensing diodes 19a, 19b, and 19c of each phase are connected to the overheat identification means 8 in parallel and the temperature sensing diodes 19a, 19b, and 19c of each phase are connected to a constant current circuit 18. The temperature sensing diodes 19a, 19b, and 19c of each phase are connected to the overheat identification means 8 in parallel because these can be one reference potential and four input lines when the forward voltage Vfu, Vfv, and Vfw of the temperature sensing diodes 19a, 19b and 19c are sensed. However, if wiring is required to sense the forward voltage Vfu, Vfv and Vfw, the manner of wiring does not matter.

The operation of this embodiment will now be described below.

The overheat identification means 8 inputs the forward voltages Vfu, Vfv and Vfw of he respective temperature sensing diodes 19a, 19b and 19c and then recognizes variations of the junction temperature Tju, Tjv and Tjw of the respective temperature sensing diode 19a, 19b and 19c. In this instance, when each temperature sensing diode 19a, 19b and 19c is formed near the switching element and the forward current if of the temperature sensing diodes 19a, 19b and 19c is set at a lower value so that the diodes themselves do not overheat, the junction temperature Tju of the U phase temperature sensing diode 19a can be read as the U phase switching element temperature, the junction temperature Tjv of the V phase temperature sensing diode 19b can be read as the V phase switching element temperature, and the junction temperature Tjw of the W phase temperature sensing diode 19c can be read as the W phase switching element temperature, respectively.

As is apparent from the foregoing description, when, every switching arm of each phase, the temperature sensing diode is formed on the same board as the power element, a fixed forward current is sent to the temperature sensing diode, and the forward voltage of the temperature sensing diode is read, it is possible to sense the switching element temperature of each phase precisely. Accordingly, by using the switching element temperature as the standard of judgment for the maximum temperature within the switching element of each phase, even if there is some deviation in the heat generating condition of the switching element of each phase, it is possible to carry out the overheat protection precisely according to the highest overheating temperature of the switching element.

6th Embodiment

Figure 6:
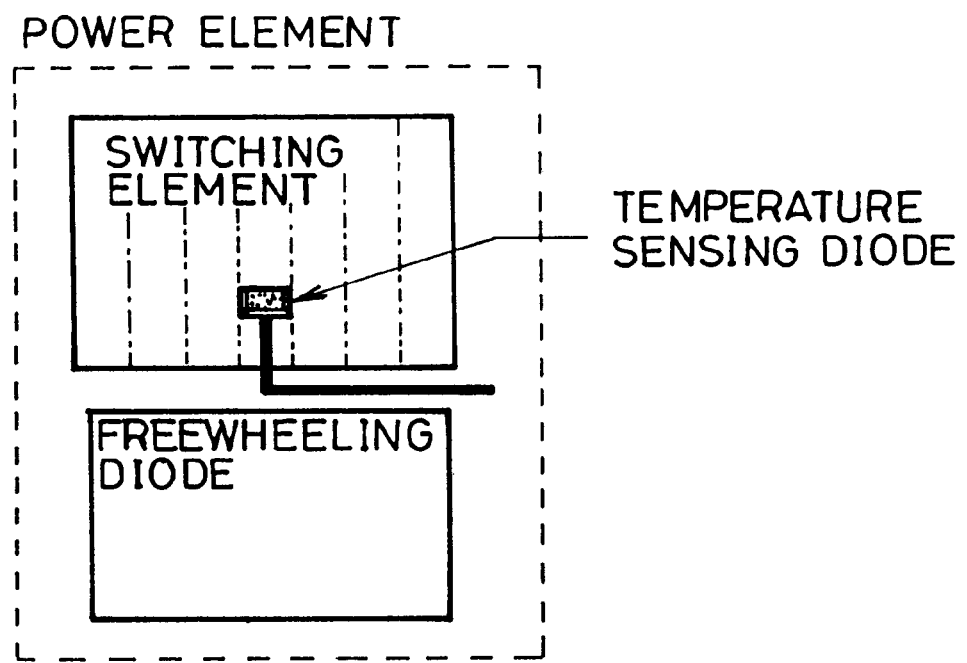
FIG. 6 is a view showing one example of a power element that is used in a sixth embodiment.

As shown in FIG. 6, one unit of a power element consists of a tip area forming the switching element and another tip area forming a freewheeling diode, on the semi-conductor board. The switching element is formed by arranging a plurality of switching elements in parallel, are adapted to send out a small amount of current. Accordingly, it is desirable to detect the temperature within the tip area forming the switching element in view of heat generation of the electrified switching element. Thus, by arranging the temperature sensing diode close to the tip area of the switching element or by forming the same within the tip area, it is possible to detect the tip temperature of the switching element for precise overheat protection without delay of heat conduction.

7th Embodiment

An on-vehicle motor control unit combined with a control computing unit 3 including a temperature monitoring means therein will be explained below with reference to FIGS. 7 and 8

Figure 7:
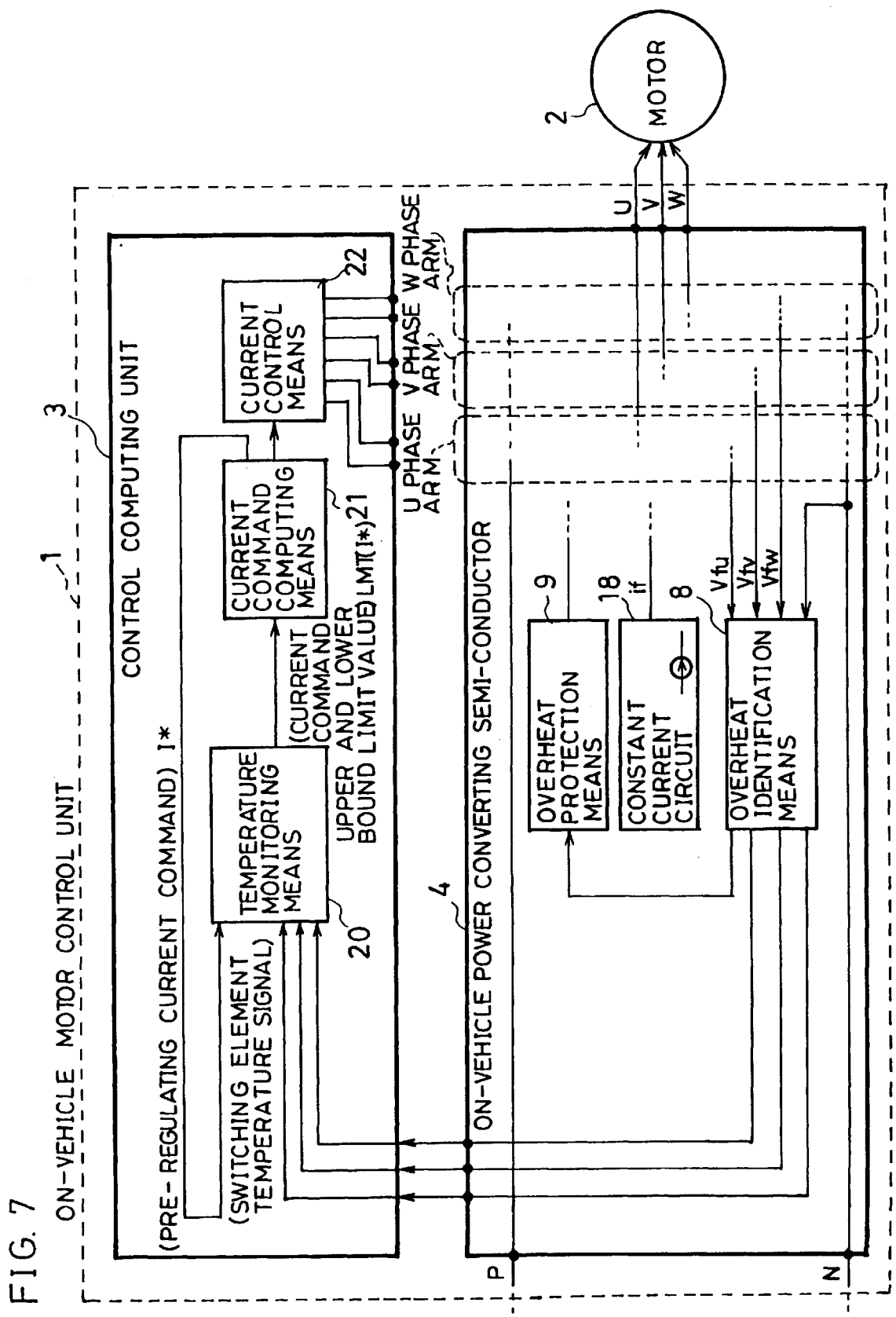
FIG. 7 is a block diagram of a motor control unit according to a seventh embodiment.

FIG. 7 is a block diagram of the on-vehicle motor control unit according to a seventh embodiment. In FIG. 7, reference numeral 3 is a control computing unit which is provided with a temperature monitoring means 20, a current command computing means 21, and a current control means 22. An on-vehicle power converting semi-conductor 4 has the same structure as in FIG. 5.

Figure 8:
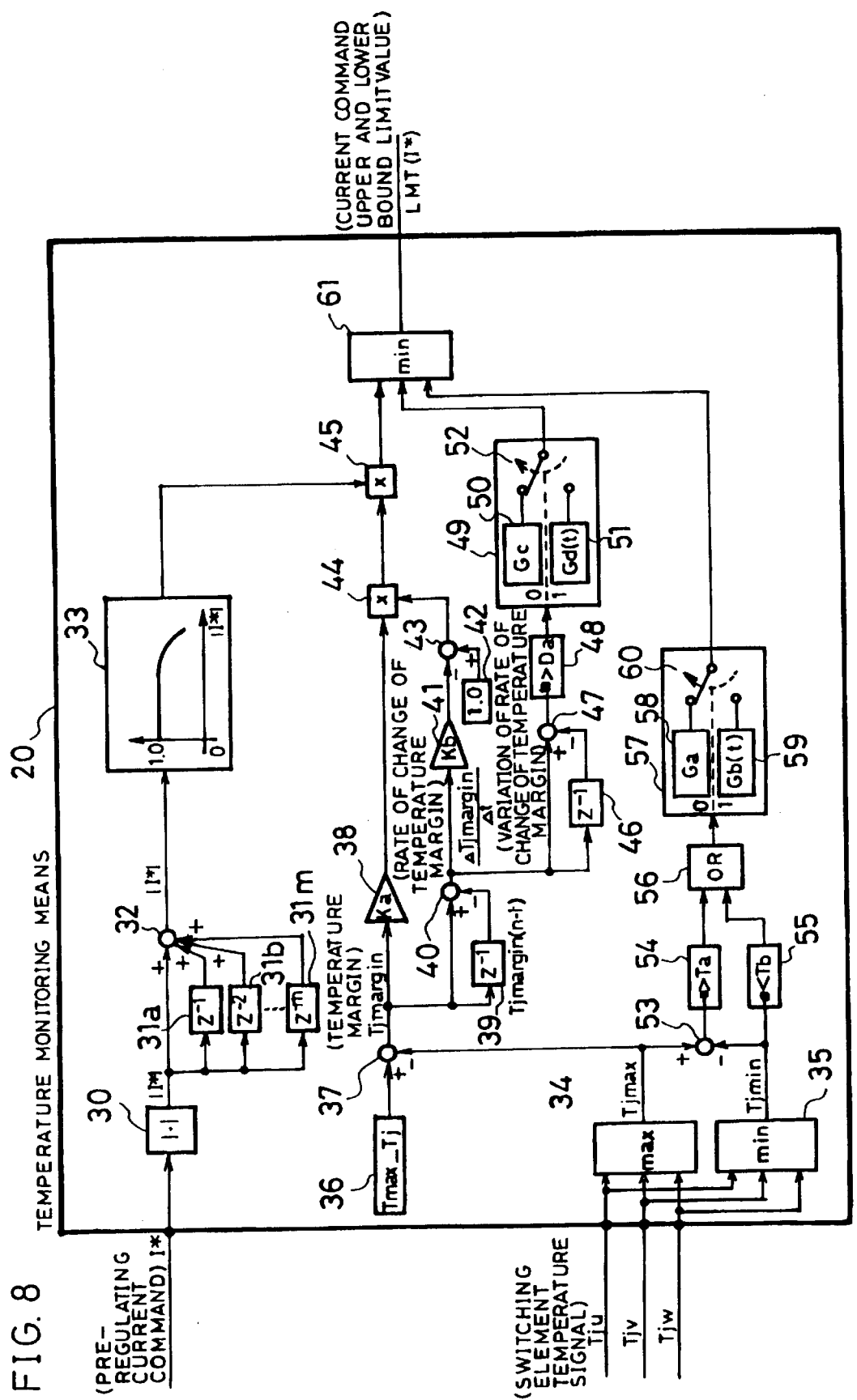
FIG. 8 is an internal block diagram of a temperature monitoring means of the seventh embodiment.

FIG. 8 is an internal block diagram of the temperature monitoring means. In the figure, reference numeral 30 is an absolute value circuit, reference numerals 31a, 39 and 46 are one-time computing pre-cycle output devices, 31b a two-times computing pre-cycle output device, 31m an m-times computing pre-cycle output device, 32 an adder, 33 a gain calculating map, 34 a maximum value output device, 35 and 61 minimum value output device, 36, 42, 50 and 58 constant output devices, 38 and 41 coefficient multipliers, 37, 40, 43, 47 and 53 subtracters, 44 and 45 multipliers, 48, 54 and 55 comparators, 49 and 57 gain computing output devices, 51 and 59 time gain tables, 52 and 60 logic selective switches, and 56 a logic unit, respectively.

The operation of the motor control unit will be described below.

Figure 5:
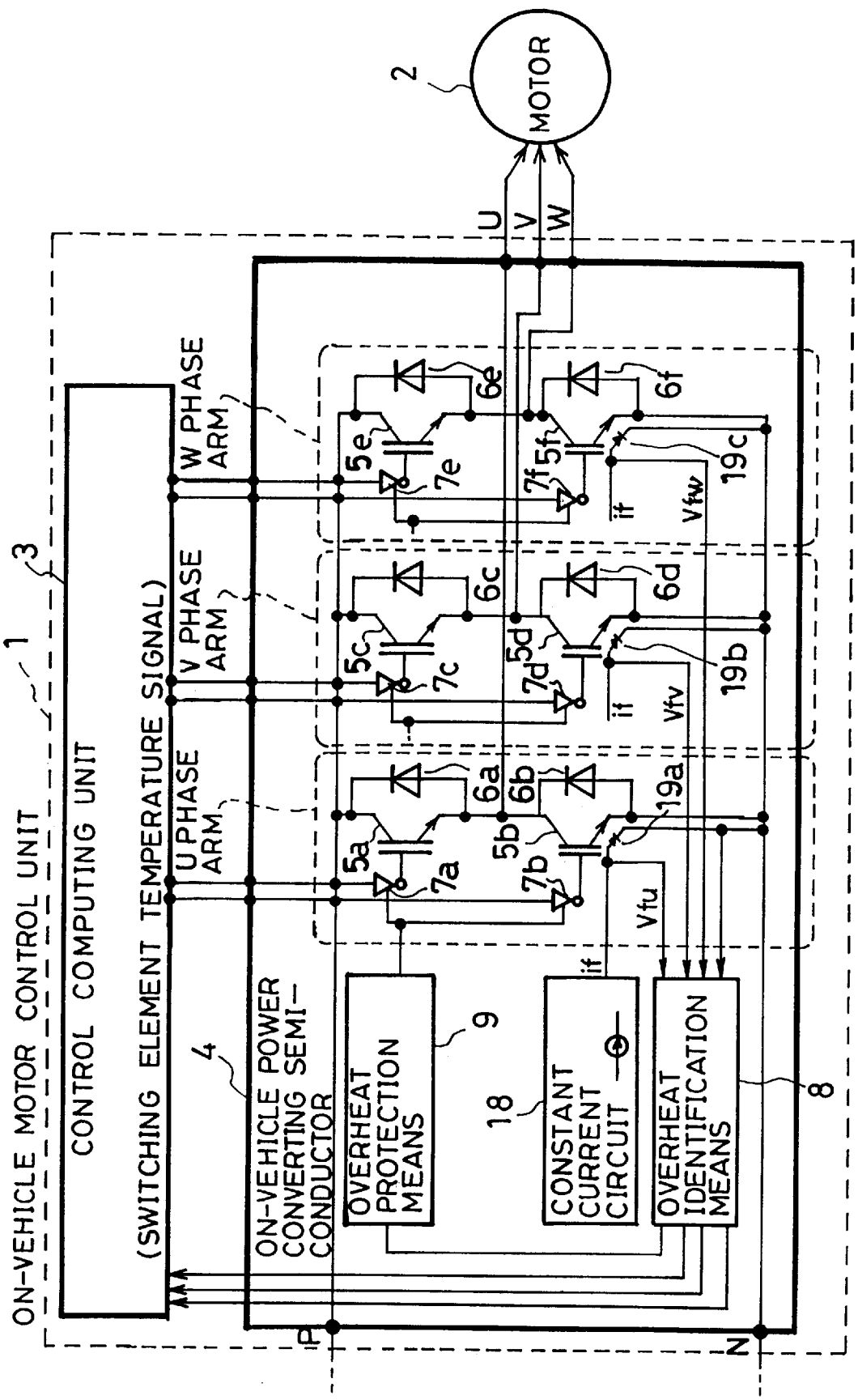
FIG. 5 is a block diagram of a motor control unit according to a fifth embodiment.

As shown in FIG. 5, the forward current if is sent to each of the temperature sensing diodes 19a, 19b and 19c and the overheat identification means 8 inputs the forward voltage Vfu, Vfv and Vfw of each of the temperature sensing diodes 19a, 19b and 19c and calculates the temperature Tju, Tjv and Tjw for each phase of the switching element. In this case, as shown in the second embodiment, it is possible to precisely calculate the switching element temperature as an absolute value by memorizing the forward voltage Vfu, Vfv and Vfw of each temperature sensing diode 19a, 19b and 19c at a fixed temperature, for example at the temperature at which the switching element temperature at a room temperature can be recognized without the help of the overheat identification means 8. The overheat identification means 8 judges whether the gate cut should be carried out or not for overheat protection based on the calculated Tju, Tjv and Tjw and sends a signal to the overheat protection means 9 when judging the gate cut should be carried out. Also, the switching element temperature Tju, Tjv and Tjw is output as the switching element temperature signal of each phase from the overheat identification means 8.

Then, when the pre-adjusting current command I* output from a current command computing means 21 and the switching element temperature Tju, Tjv and Tjw are input to the temperature monitoring means 20, the current command upper and lower bound limit value LMT (I*) is output to the current command computing means 21.

As specifically shown in FIG. 8, when the switching element temperature Tju, Tjv and Tjw are input to the maximum value output device 34, the maximum value Tjmax of Tju, Tjv and Tjw is selected and output. The subtracter 37 subtracts the maximum value Tjmax from a constant Tmax−Tj output from the constant output device 36 and outputs a temperature margin Tjmargin. The constant Tmax−Tj is set at a value corresponding to the temperature that damages the switching element by overheat. Then, Tjmargin is multipled by Ka in the coefficient multiplier 38 and the value corresponding to the upper and lower limit values of electricity to be sent to the motor 2 is output. Namely, the current is limited according to the temperature margin Tjmargi and the gain Ka is determined by the extent of the temperature rise, heat radiation performance and the like of the switching element relative to an amount of electric current.

Also, the temperature margin Tjmargin is input to a one-time computing pre-cycle output device 39 and the temperature margin of the cycle immediately before the computing cycle Tjmargin (n−1) is outputted therefrom. The computing cycle handles passage of time discretely and the cycle is shown by Δt. The temperature margin of the present cycle is shown as Tjmargin (n) and the temperature margin of the $m^{th}$ cycle before the computing cycle is shown as Tjmargin (n−m). Referring to the subtracter 40, the temperature margin of the cycle immediately before the cycle Tjmargin (n−1) is subtracted from the temperature margin of the present cycle Tjmargin (n) and a rate of change of temperature margin per cycle Δt (Tjmargin (n)−Tjmargin (n−1)/Δt =Δtjmargin/Δt is output. Then, the rate of change (Δtjmargin/Δt) is input to the coefficient multiplier 41 and is multiplied by the gain Kb. In the subtracter 43, the output of the coefficient multiplier 41 is subtracted from the output of the constant output device 42 to output 1.0−Kb×(ΔTjmargin/Δt). Next, the output of the coefficient multiplier 38 is multiplied by the output of the subtracter 43. Multiplying 1.0−Kb×(Δtjmargin/Δt) corresponds to adjusting the value corresponding to the upper and lower bound limit value of electricity (Kb×Tj margin) to be sent to the motor 2 according to the rate of change of temperature margin per cycle Δt (ΔTj margin/Δt). Namely, if the decrease of the temperature margin is large, then the upper and lower bound limit value of the electricity is set at a smaller value, while if the increase of the temperature margin is large, the upper and lower bound limit value is set at a larger value.

On the other hand, the pre-adjusting current command I* output from the current command computing means 21 is input to a absolute value circuit 30 upon feedback and the absolute value |I*| of the pre-adjusting current command I* is output. When |I*| is input to each computing pre-cycle output devices 31a~31m, |I*|(n−1), |I*|(n−2), . . . . |I*|(n−m) are output, respectively. Next, |I*|(n−1), |I*|(n−2), . . . . |I*|(n−m) and |I*|(n) are input to the adder 32 to obtain the sum total Σ|I*|. When Σ|I*| is input to the gain calculating map 33, an adjusting gain amount corresponding to the sum total Σ|I*| is output. In the multiplier 45, the output of the multiplier 44 is multiplied by the output from the gain calculating map for output. Namely, this output corresponds to adjusting the upper and lower bound limit value of the electricity to be sent to the motor 2 according to the amount of the sum total Σ|I*| of the absolute value of the pre-adjusting current command I* for the term of the past m×Δt. The gain calculating map 33 is determined by the heat radiation performance and the like relative to the amount of current.

Further, the switching element temperatures Tju, Tjv and Tjw are input to a minimum value output device 35 and the minimum value Tjmin of Tju, Tjv and Tjw is output. Then, the difference between the output Tjmax of the maximum value output device 34 and the output Tjmin of the minimum value output device 35, that is, the difference (Tjmax−Tjmin) between the maximum and minimum temperature of the switching element of each phase is output. Next, when the output of the subtracter 53 is input to the comparator 54, a judgment is made as to which is larger: (Tjmax−Tjmin) or the constant Ta. When (Tjmax−Tjmin)>Ta, logic 1 is output and when (Tjmax−Tjmin)≦Ta, logic 0 is output. Also, the output Tjmin of the minimum value output device 35 is output to the comparator 55 for comparison with the constant Tb. When Tb>Tjmin, logic 1 is output and when Tb≦Tjmin, logic 0 is output. Next, 1 or 0 is output in a logic operation by OR logic unit 56.

Figure 9:
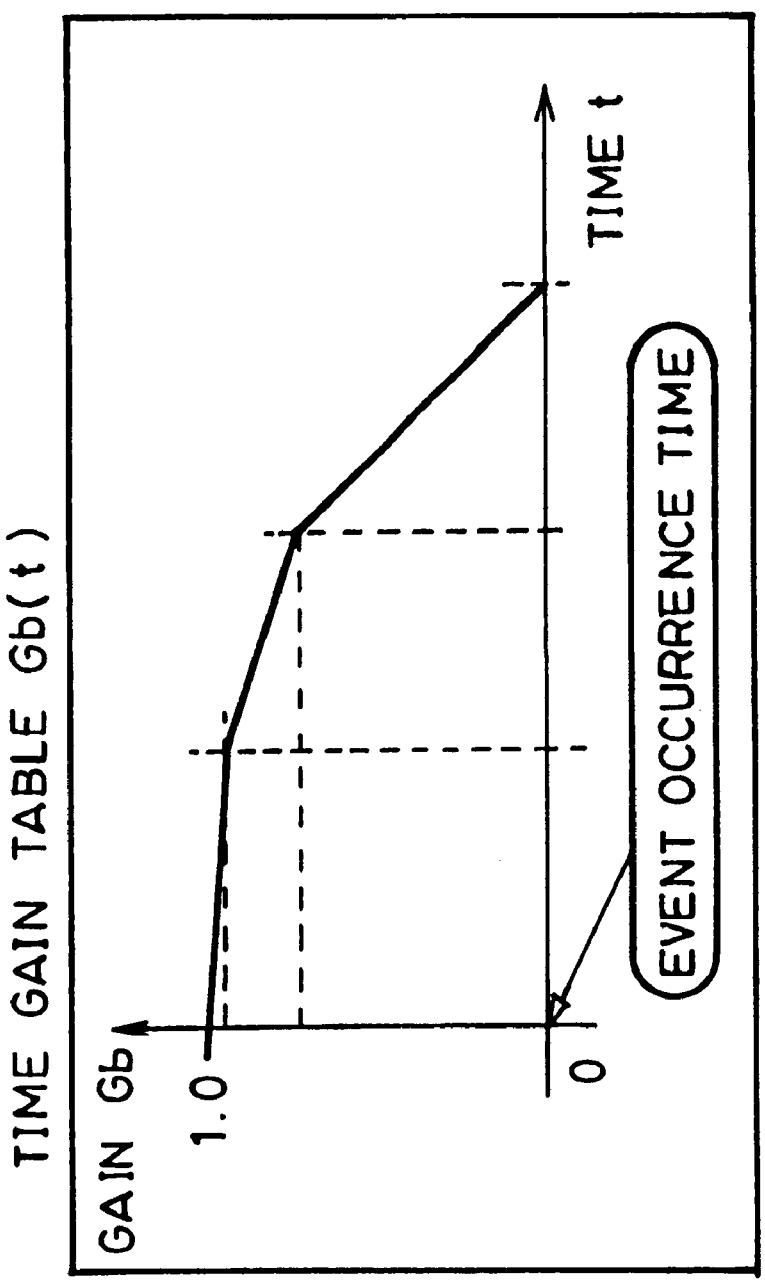
FIG. 9 is a view showing a time gain table within the temperature monitoring means of the seventh embodiment.

The output of the OR logic computing element 56 is input to a gain computing means 57 and the value corresponding to the upper and lower bound limit value of current to be sent to the motor 2 is output. The gain computing means 57 consists of the constant output device 58, the time gain table 59, and the logic selective switch 60. The gain computing means 57 is designed to output the value Ga of the constant output device 58 when the input logic is 0, and to output the value Gb (t) of the time gain table 59 when the input logic is 1. FIG. 9 shows the time gain table 59 in detail. In FIG. 9, the lateral axis shows time t from event generation time and the vertical axis shows the gain output value. That is, the time when an input logic to the gain computing means changes to 1 from 0 is the event generation time and the gain output value Gb corresponding to elapsed time from that point is output. Referring to the gain Gb in FIG. 9, the value right after the event generation is Ga and gradually decreases to 0. This is because when there is a failure such as a diode failure or signal wire breakage in signal transmission from the temperature sensing diodes 19a~19c through the overheat identification means 8 to the temperature monitoring means 20, the sudden increase in temperature difference (Tjmax−Tjmin) between the switching elements of each phase or sudden drop in the minimum temperature Tjmin is automatically detected and as a result, the action of the motor 2 can be controlled moderately without affecting the control continuity.

When a rate of change of the temperature margin (ΔTjmargin/Δt) that is the output of the subtracter 40 is input to the one-time computing pre-cycle output device 46, the rate of change of the temperature margin of the cycle immediately before the cycle (ΔTjmargin/Δt (n−1)) is output. Then, in the subtracter 47, the rate of change of the temperature margin of the cycle immediately before the cycle (ΔTjmargin/Δt (n−1) ) is subtracted from the rate of change of the temperature margin of the present cycle (ΔTjmargin/Δt (n) ) and the variation component of the rate of change of temperature margin per cycle Δt is output. Then, in the comparator 48, the variation component of the rate of change of the temperature margin that is the output of the subtracter 47 and the constant Da are compared to find which is the larger.

When (the variation component of the rate of change of the temperature margin)>the constant Da, logic 1 is output and when (the variation component of the rate of change of the temperature margin)≦the constant Da, logic 0 is output. The output of the comparator 48 is input to the gain computing means 57 and the value corresponding to the upper and lower bound limit value of the current to be sent to the motor 2 is output. The gain computing means 49 consists of a constant output device 50, a time gain table 51 and a logic selective switch 52. The gain computing means 49 outputs the value Gc of the constant output device 50 when the input logic is 0 and the value Gd (t) of the time gain table 51 when the input logic is 1, respectively. The time gain table 51 is shown in detail in FIG. 9. That is, the time when the input logic to the gain computing means changes to 1 from 0 is regarded as the event generation time and the gain output value Gd corresponding to the subsequent elapsed time is output. The gain Gb has the value Gc right after the event generation and decreases gradually to 0. This is because when there is a failure such as a diode failure, signal wiring breakage or the like in the signal transmission from the temperature sensing diodes 19a~19c through the overheat identification means 8 to the temperature monitoring means 20, the sudden increase in the difference of the maximum temperature between the switching element of each phase can be automatically detected and, as a result, the action of the motor 2 can also be controlled moderately without affecting the control continuity.

Next, the minimum value output device 61 inputs the outputs of the multiplier 45 and the gain computing means 49 and 57 and outputs their minimum value as a current command upper and lower bound limit value LMT (I*).

The current command computing means 21 inputs the current command upper and lower bound limit value LMT (I*) being output from the temperature monitoring means 20 and limits the upper and lower bound of the absolute value of pre-adjusting current command I* to LMT (I*), which is then output to the current control means 22 as the adjusted current command I**.

The current control means 22 generates and outputs a gating signal for each switching element so that the current of the motor 2 can follow the current command I. Since a computing method for the current command in the current command computing means 21 and a current control method and a gating signal generating method in the current control means 22** are not peculiar to our invention, but many other methods are known and available to the public, no further description is given here.

As described above, according to the seventh embodiment, since the switching element temperature and the current command value to the motor are arranged so that they can be monitored in time sequence, it is possible to provide the switching element with proper overheat prevention according to the extent of the temperature rise. Also, since the failure of the temperature sensing diode, the breakage of the temperature information signal line and the like can be automatically detected and as a result, the motion of the motor can be varied moderately, it is effective in that the continuity of control and behavioral stability of the vehicle are secured.

$8^{th}$ Embodiment

Figure 10:
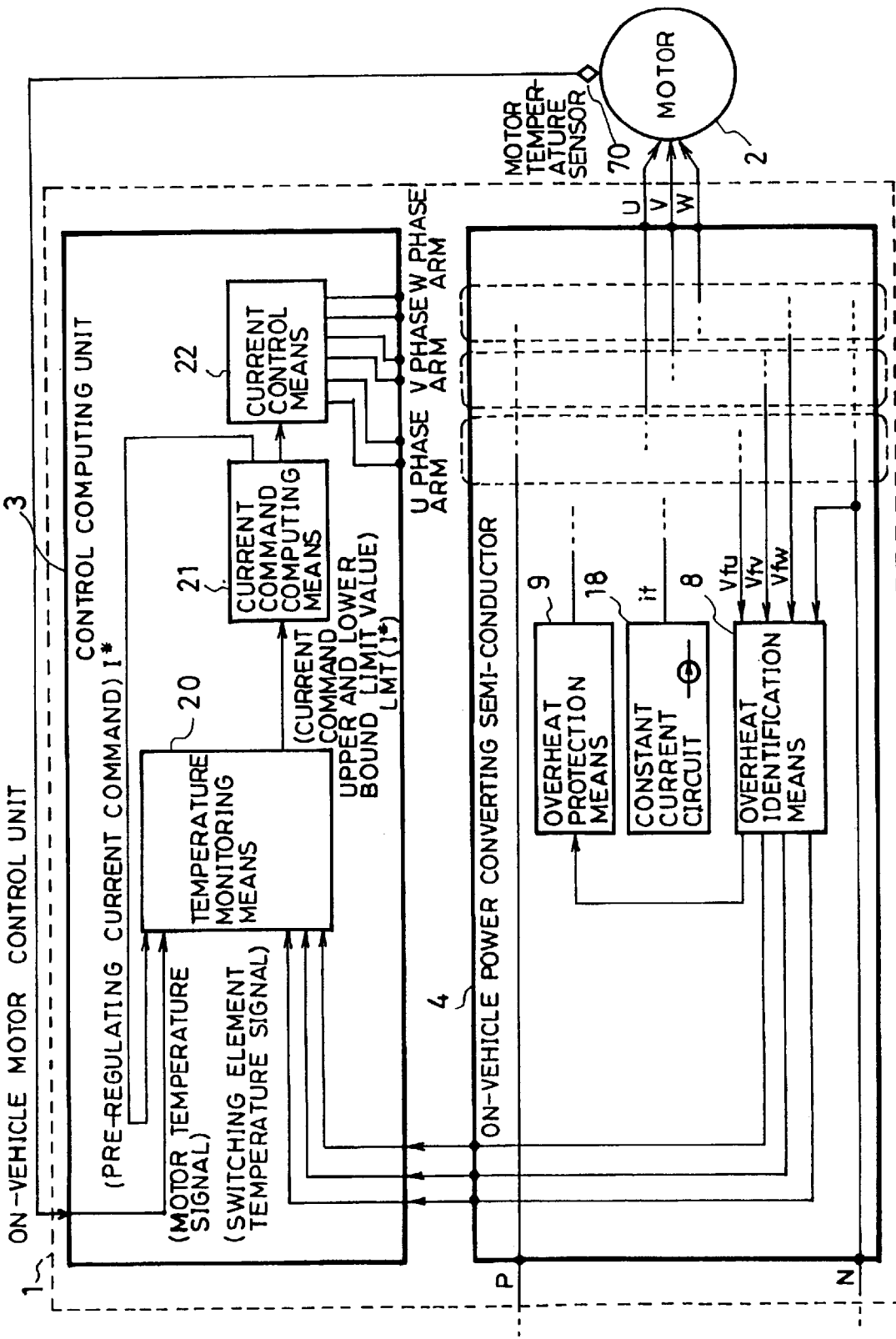
FIG. 10 is a block diagram of a motor control unit according to an eighth embodiment.
Figure 11:
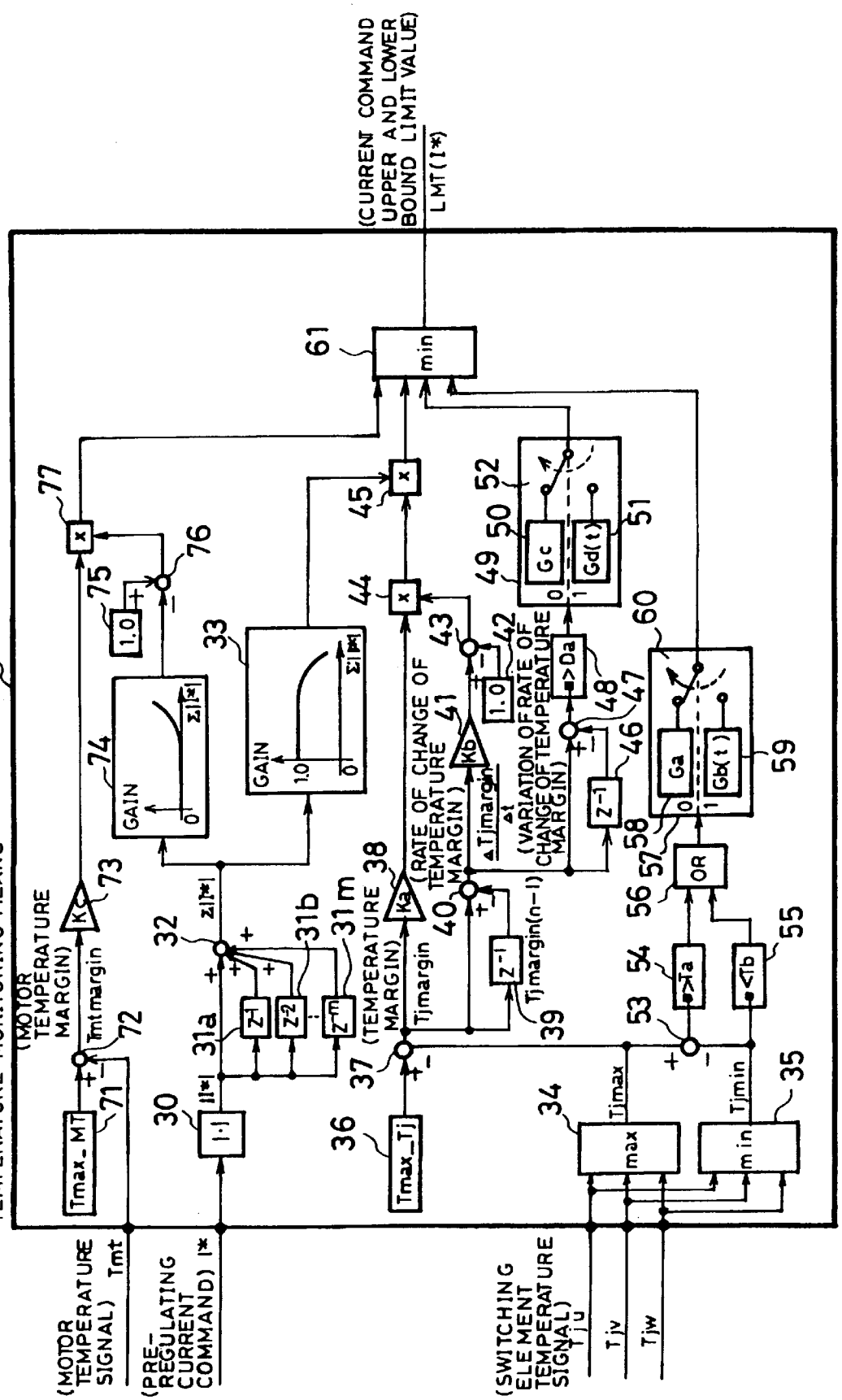
FIG. 11 is an internal block diagram of the temperature monitoring means according to the eighth embodiment.

An overheat prevention function of the motor may be added to the seventh embodiment. Namely, a temperature monitoring means of the eighth embodiment also inputs a motor temperature signal from a motor temperature sensor 70 as shown in FIG. 10. In addition to the structure of FIG. 8, the temperature monitoring means 20 is designed to input and process the temperature information of the motor 2 as shown in FIG. 11.

The operation of the embodiment will now be explained below.

The operation common to FIG. 8 is omitted here.

When the temperature Tmt of the motor 2 is detected from the motor temperature sensor 70 and input to the temperature monitoring means 20, in the subtractor 72, the Tmt is subtracted from the constant Tmax_MT from the constant output device 71 to output a motor temperature margin Tmtmargin. Here, the constant Tmax_Mt is set at a value corresponding to a temperature that overheats and damages the motor 2. Then, the motor temperature margin Tmtmargin is, in the coefficient multiplier 73, multiplied by a gain Kc and output as a value corresponding to the upper and lower bound limit value of the current to be sent to the motor 2. Namely, the current is adapted to be limited according to the value of the motor temperature margin Tmtmargin and the gain Kc is determined by the extent of the temperature rise of the motor 2 relative to an amount of current, heat radiation performance and the like. Further, the sum total Σ|I*| of |I*| (n−1), |I*| (n−2), . . . ,|I*| (n−m) and |I*| (n) output from the adder 32 is input to the gain calculating map 74 and an adjusting gain amount corresponding to the amount of the sum total Σ|I*| is output. The adjusting gain amount is set at 0 or a small value when the sum total Σ|I*| is small and set at a higher value when the sum total Σ|I*| is larger. Further, the constant 1.0 is output from the constant output device 75. In the subtracter 76, the output of the gain calculating map 74 is subtracted from the constant 1.0 and input. Here, multiplication of {1.0−(output of the gain calculating map)} corresponds to adjusting the value corresponding to the upper and lower bound of the current to be sent to the motor 2 relating to the motor temperature margin according to the amount of the sum total Σ|I*| of the absolute value of the pre-adjusting current command I* for the period of the past m×Δt . Namely, the larger the amount of sum total Σ|I*|, the smaller the upper and lower bound limit value of the current.

Next, the minimum value output device 61 inputs the output of the multiplier 77 and 45 and the gain computing means 49 and 57 and outputs the smallest value of these as the current command upper and lower bound limit value LMT (I*). The current command computing means 21 inputs the current command upper and lower bound limit value LMT (I*) being output from the temperature monitoring means 20 and limits the upper and lower bound of the absolute value of the pre-adjusting current command I* to LMT (I*) and outputs this to the current control means 22 as the adjusted current command I**.

The current control means 22 generates and outputs the gating signal of each switching element so that the current of the motor 2 can follow the current command I**.

According to the above structure, overheat prevention of the switching element as well as of the motor is possible.

9th Embodiment

In addition to the structure where the temperature is detected based on the forward voltage of the temperature sensing diode, shown here is another structure where is provided with a means for sensing the collector-to-emitter voltage of a bipolar transistor serving as the switching element and calculating the current value sent to the switching element.

The ninth embodiment will be explained below with reference to FIGS. 12 and 13.

Figure 12:
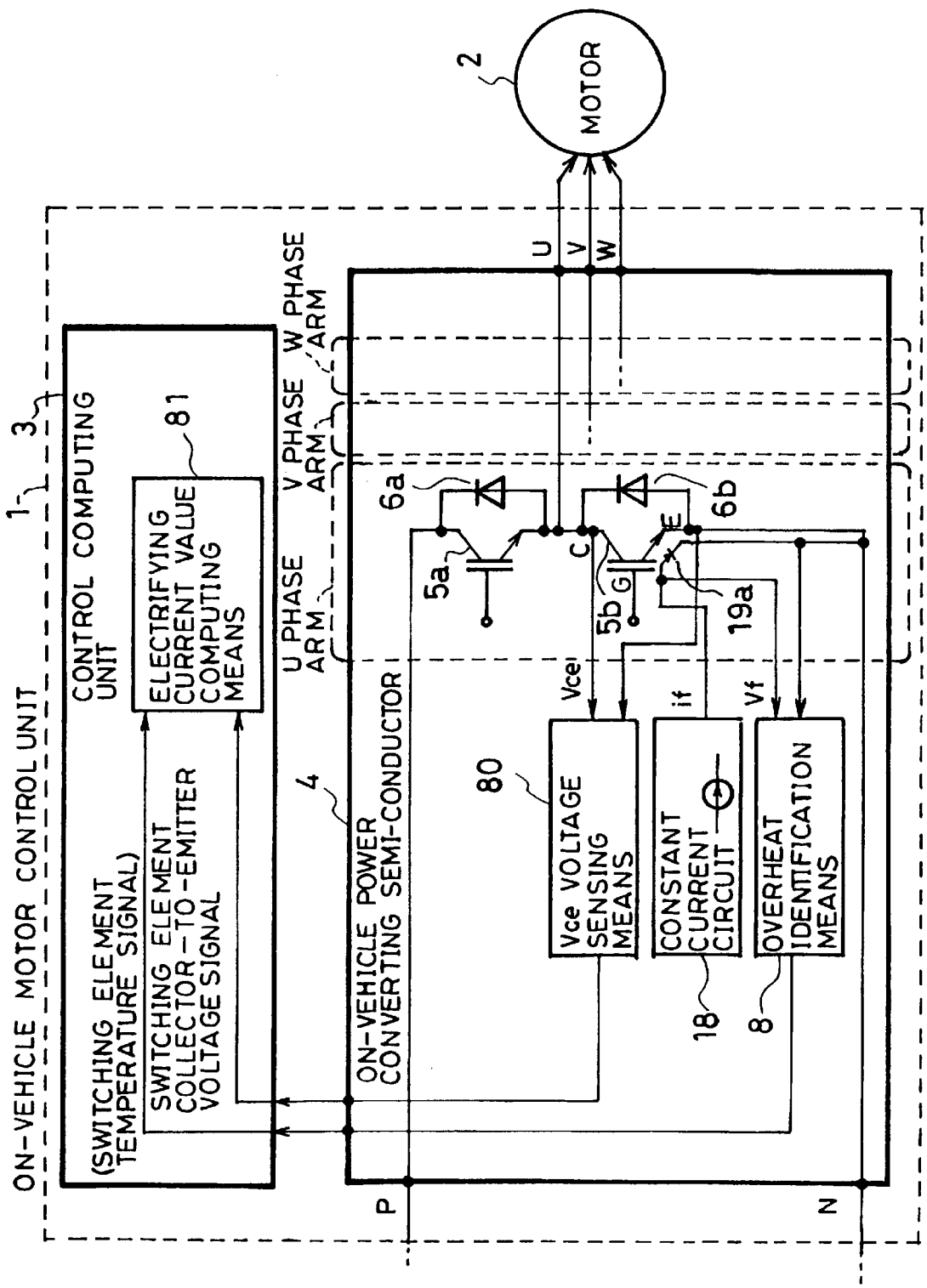
FIG. 12 is a block diagram of a motor control unit according to a ninth embodiment.

In FIG. 12, reference numeral 80 is a Vce voltage sensing means for sensing the collector-to-emitter voltage of the switching element and reference numeral 81 is a current value computing means for calculating the current value sent to the switching element based on the collect-to-emitter voltage sensed by the Vce voltage sensing means. The operating principle for sensing the current to be sent to the switching element according to the ninth embodiment will now be explained.

Figure 13:
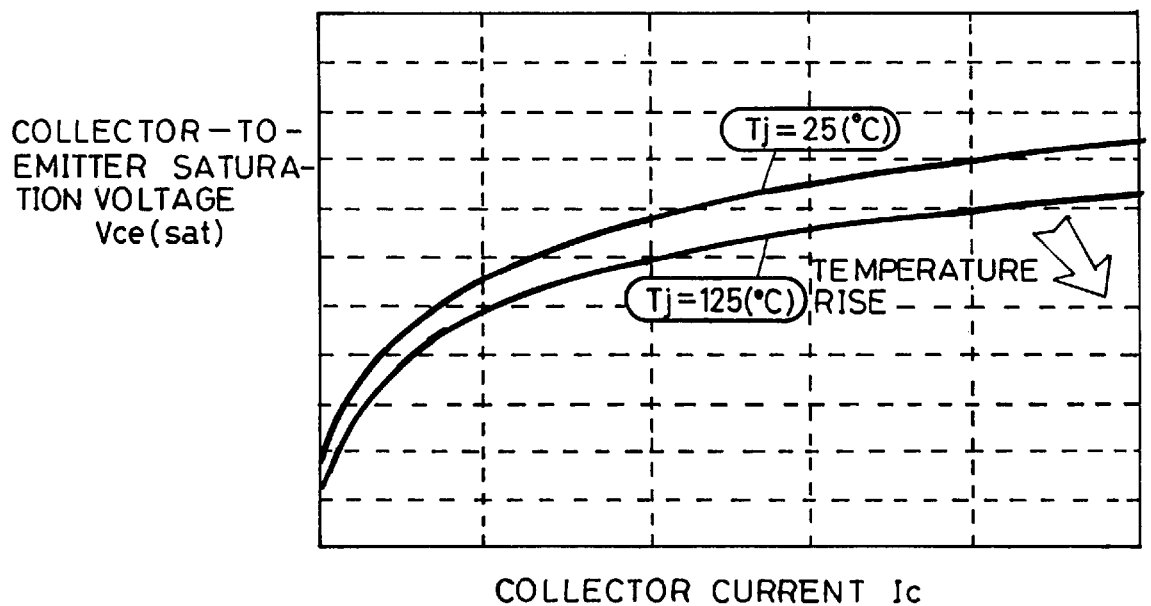
FIG. 13 is a view explaining the motion principle of the ninth embodiment.
Figure 14:
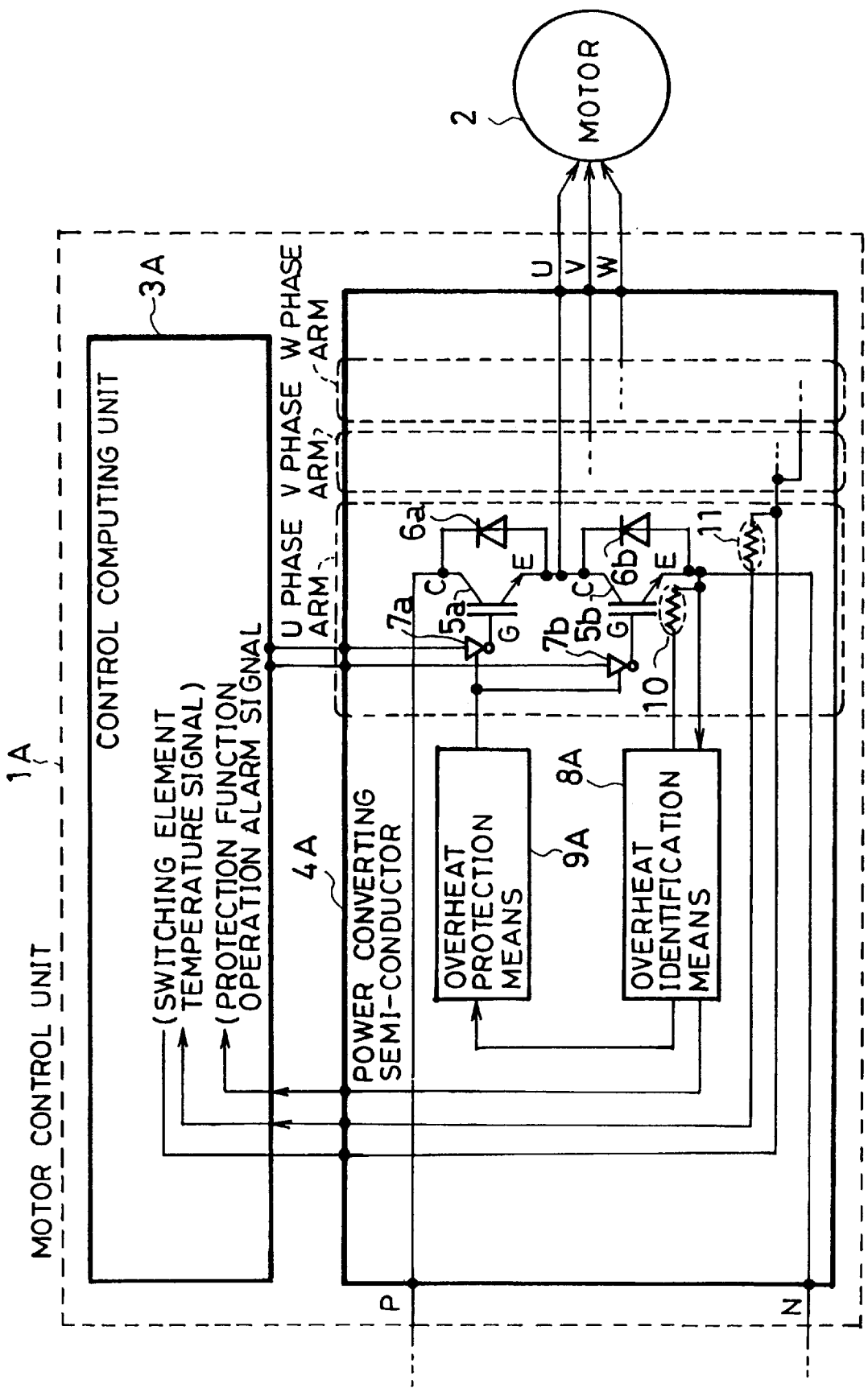
FIG. 14 is a block diagram showing a motor control unit as a first conventional example.
Figure 15:
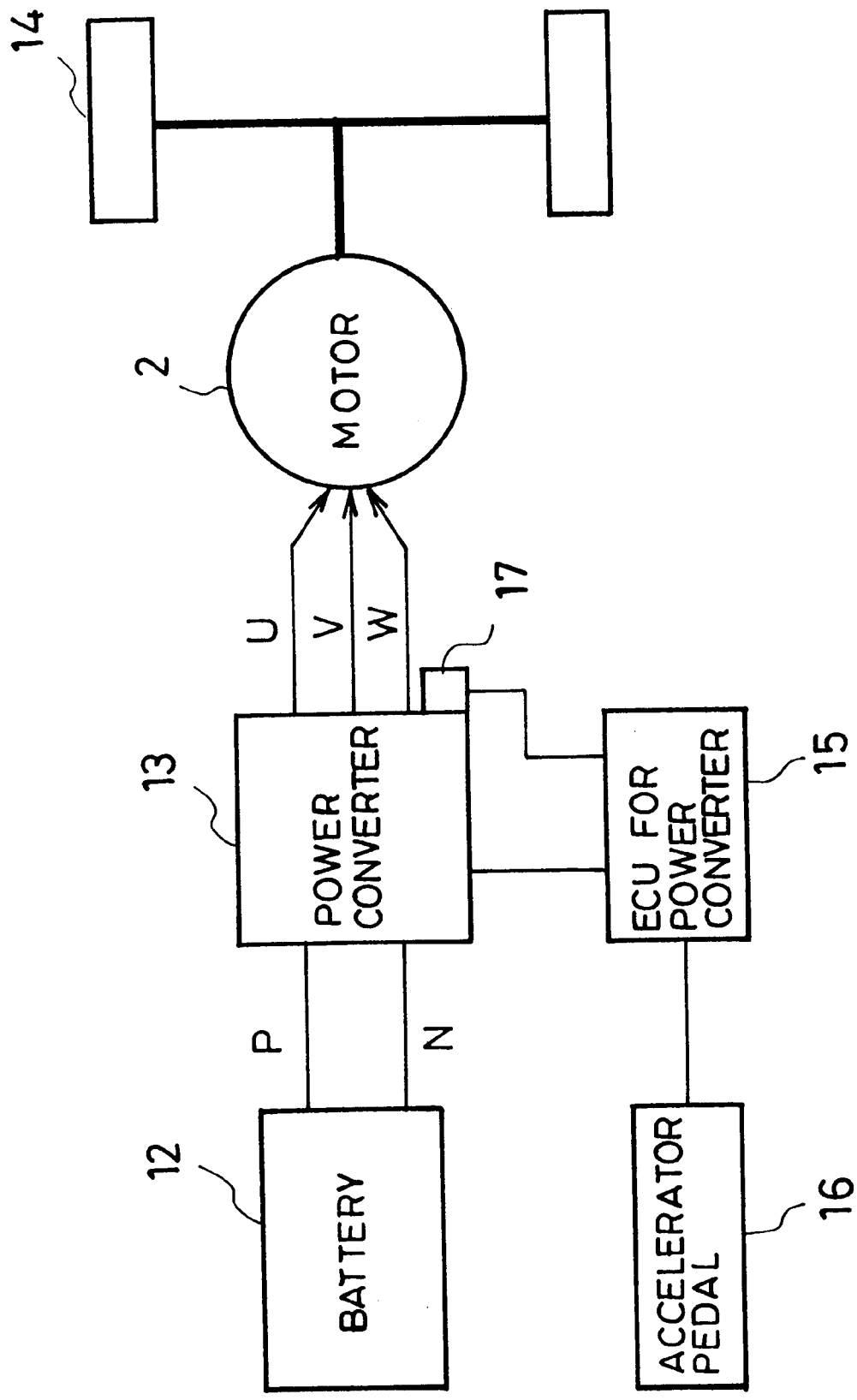
FIG. 15 is a block diagram showing an on-vehicle motor control unit as a second conventional example.

FIG. 13 shows characteristics of a collector current Ic of the switching element and a collector-to-emitter saturation voltage Vce (Sat). Sufficient voltage is applied to a gate G of the switching element to use the switching element in a saturation region. When the switching element is turned on to send the collector current Ic, a voltage Vce (sat) is generated between the collector C and the emitter E. In this case, the characteristics of an amount of the collector-to-emitter saturation voltage Vce (sat) relative to an amount of the collector current Ic vary depending on the junction temperature Tjsw of the switching element and the voltage applied to the gate G, but are determined inherently by the switching element. Accordingly, if the voltages applied to the gate G and the junction temperature Tjsw are already known, with these characteristics, it is possible to sense the collector current Ic, that is, the current value sent to the switching element, from the collector-to-emitter saturation voltage Vce (sat).

The operation of this embodiment will now be explained.

The collector-to-emitter voltage of the switching element is sensed by the Vce voltage sensing means 80 and output to a current value computing means 81 as the collector-to-emitter voltage signal. Also, a constant forward current if is supplied to the temperature sensing diode 19a by a constant current circuit 18 and the forward voltage vf of the temperature sensing diode 19a is input to the overheat identification means 8. The overheat identification means 8 outputs the switching element temperature signal Tj to the current value computing means 8 based on the forward voltage vf. When the collector-to-emitter voltage signal and the switching element temperature signal Tj are input, the current value computing means 81 calculates the current (corresponding to the collector current Ic) to be sent to the switching element based on the characteristics of the collector current Ic and the collector-to-emitter saturation voltage Vce (sat) as shown in FIG. 13. It is advisable to let the current value computing means 81 memorize the characteristics of the collector current Ic and the collector-to-emitter saturation voltage Vce (sat) including the dependence on the switching element temperature Tj in the form of an approximate calculation formula or a reference table map.

With this, it is possible to calculate the current value to be sent to the switching element quickly and precisely.

In the ninth embodiment, an FET is used for the switching element. It is also possible to have a voltage sensing means for sensing a drain voltage (output terminal voltage) of this FET and a means for calculating the current value sent to the switching element.

In FIG. 12 of the ninth embodiment, the overheat protection means 9 is not provided, but it is, of course, possible to provide the overheat prevention with the overheat protection means 9.

Also, in each embodiment, it is possible to use the P-N junction of the transistor in place of the temperature sensing diode. The semi-conductor element including the P-N junction may be disposed near the switching element.

It is also possible to use the FET as the switching element in each of the embodiments. In this case, a source and a source voltage are to be controlled.

As described above, according to the motor control unit of the present invention, the semi-conductor element including the P-N junction is disposed near the switching element and this semi-conductor element is connected to a constant current circuit. The temperature of the switching element can be recognized by sensing the forward voltage value in the P-N junction of the semi-conductor element. The overheat prevention means is provided to place the switching element in an OFF-state when the switching element is judged to be in an overheat condition based on the recognized switching element temperature. According to this structure, it is possible to sense the switching element temperature forming the power element of the power converting semi-conductor quickly and precisely and also possible to properly keep the switching element from overheating.

To let the action of the motor vary moderately in case of failure of the semi-conductor element or wiring breakage, the control computing unit is provided. The control computing unit is provided with the monitoring means for controlling the current command value. In addition to this effect, the motor control unit has an advantage that the continuity of control is secured.

The motor control unit is provided in which both the temperature and overheat prevention of the motor have been considered.

The control computing unit is provided with the current calculating means which can calculate the current value sent to the switching element based on the temperature and output terminal voltage value of the switching element. With this arrangement, it is possible to calculate the current value sent to the switching element quickly and precisely.

What is claimed is:

1. A motor control unit comprising:

a first switching element disposed on a high potential side;

a second switching element disposed on a low potential side;

a plural phase of switching arms connecting the first switching element and the second switching element together in series and connected to a direct-current power input in parallel to supply an alternating-current motor with alternating-current power from between each switching element of each switching arm;

a control computing unit for controlling the switching of each switching element to control the current of the motor; and wherein a semi-conductor element including a P-N junction is disposed near at least one of said switching elements and connected to a constant current circuit, and wherein an overheat prevention means is provided to recognize the temperature of the switching elements by sensing a forward voltage value between the P-N junction of the semi-conductor element and to place the said at least one switching element in an OFF-state when the said at least one switching element is judged to be in an overheat condition based on the recognized temperature of the said at least one switching element.

2. A motor control unit according to claim 1, wherein said control computing unit further comprises a current command value computing means for computing a current command value sent to the motor, a current control means for controlling the current sent to the motor based on the current command value, and a monitoring means for inputting the motor temperature, the said at least one switching element temperature and the current command value, monitoring the relation between the motor temperature, the said at least one switching element temperature and the current command value in time sequence, and controlling the current command value to let the action of the motor vary moderately in the case of failure such as damage to the semi-conductor element and wire breakage.

3. A motor control unit according to claim 1, wherein the overheat prevention means is adapted to memorize the forward voltage value of the semi-conductor element in advance at a fixed temperature so that it can recognize variations of the said at least one switching element temperature as the absolute magnitude.

4. A motor control unit according to claim 1, wherein the overheat prevention means is designed to transmit the said at least one switching element temperature to the control computing unit in the form of an analog signal.

5. A motor control unit according to claim 1, wherein the overheat prevention means is designed to output information as to whether the overheat prevention of the said at least one switching element is presently being carried out or not to the control computing unit in the form of a digital signal.

6. A motor control unit according to claim 1, wherein the overheat prevention means is designed to recognize the highest temperature of each phase of the said at least one switching element and make a judgment based on this highest temperature.

7. A motor control unit according to claim 1, wherein the semi-conductor element is arranged within or close to a chip area where the said at least one switching element is formed.

8. A motor control unit according to claim 1, wherein a diode is used as the semi-conductor element.

9. A motor control unit comprising:

a first switching element disposed on a high potential side;

a second switching element disposed on a low potential side;

a plural phase of switching arms connecting the first switching element and the second switching element together in series and connected to a direct-current power input in parallel to supply an alternating-current motor with alternating-current power from between each switching element of each switching arm;

a control computing unit for controlling the switching of each switching element to control the current of the motor; and wherein a semi-conductor element including a P-N junction is disposed near at least one of said switching elements and connected to a constant current circuit; wherein an overheat prevention means is provided to recognize the temperature of the said at least one switching element by sensing a forward voltage value between the P-N junction of the semi-conductor element and to place the said at least one switching element in an OFF-state when the switching element is judged to be in an overheat condition based on the recognized temperature of the said at least one switching element;

and wherein said control computing unit further comprises a current command value computing means for computing a current command value sent to the motor, a current control means for controlling the current sent to the motor based on the current command value, and a monitoring means for inputting the temperature of the said at least one switching element and the current command value, monitoring the relation between the said at least one switching element temperature and the current command value in time sequence and controlling the current command value to let the action of the motor vary moderately in case of failure such as damage to the semi-conductor element and wire breakage.

10. A motor control unit comprising:

a first switching element disposed on a high potential side;

a second switching element disposed on a low potential side;

a plural phase of switching arms connecting the first switching element and the second switching element together in series and connected to a direct-current power input in parallel to supply an alternating-current motor with alternating-current power from between each switching element of each switching arm;

a control computing unit for controlling the switching of each switching element to control the current of the motor;

and wherein a semi-conductor element including a P-N junction is disposed near at least one of said switching elements and connected to a constant current circuit; wherein a recognition means is provided to sense a forward voltage value between the P-N junction of the semi-conductor element and recognize the temperature of the said at least one switching element, and a voltage sensing means is provided to sense an output terminal voltage value of the said at least one switching element, and wherein said control computing unit is further provided with a current calculating means for calculating a current value sent to the said at least one switching element based on the switching element temperature and the output terminal voltage value of the said at least one switching element.

11. A motor control unit according to claim 10, wherein an overheat prevention means is provided to place the said at least one switching element in an OFF-state when the said at least one switching element is judged to be in an overheat condition based on the said at least one switching element temperature recognized by the recognition means.

12. A motor control unit according to claim 10, wherein a bipolar transistor is used for the said at least one switching element, and the voltage sensing means detects the collector-to-emitter voltage value of the bipolar transistor.

* * * * *